United States Patent
Leng et al.

(10) Patent No.: US 8,498,084 B1
(45) Date of Patent: Jul. 30, 2013

(54) MAGNETORESISTIVE SENSORS HAVING AN IMPROVED FREE LAYER

(75) Inventors: Qunwen Leng, Palo Alto, CA (US);
Christian Kaiser, San Jose, CA (US);
Yimin Guo, San Jose, CA (US);
Mahendra Pakala, Fremont, CA (US);
Sining Mao, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 593 days.

(21) Appl. No.: 12/506,978

(22) Filed: Jul. 21, 2009

(51) Int. Cl.
*G11B 5/127* (2006.01)

(52) U.S. Cl.
USPC ........................................ 360/324.2

(58) Field of Classification Search
USPC ............... 360/324.11, 324.12, 324.2, 324.21, 360/324.1
See application file for complete search history.

(56) References Cited

U.S. PATENT DOCUMENTS

| | | |
|---|---|---|
| 5,764,445 A | 6/1998 | Torng et al. |
| 6,322,640 B1 | 11/2001 | Xiao et al. |
| 6,330,542 B1 | 12/2001 | Sevcik et al. |
| 6,347,049 B1 | 2/2002 | Childress et al. |
| 6,413,325 B1 | 7/2002 | Shimazawa et al. |
| 6,535,294 B1 | 3/2003 | Arledge, Jr. et al. |
| 6,680,831 B2 | 1/2004 | Hiramoto et al. |
| 6,690,163 B1 | 2/2004 | Hoshiya et al. |
| 6,717,686 B1 | 4/2004 | Farros et al. |
| 6,724,581 B2 | 4/2004 | Westwood |
| 6,751,073 B2 | 6/2004 | Hasegawa |
| 6,791,792 B2 | 9/2004 | Takahashi |
| 6,819,532 B2 | 11/2004 | Kamijo |
| 6,841,395 B2 | 1/2005 | Linn |
| 6,848,169 B2 | 2/2005 | Shin et al. |
| 6,876,507 B2 | 4/2005 | Chen et al. |
| 6,937,434 B2 | 8/2005 | Takahashi |
| 7,077,929 B2 | 7/2006 | You et al. |
| 7,149,709 B1 | 12/2006 | Lopez, Jr. |
| 7,160,572 B2 | 1/2007 | Fujikata et al. |
| 7,211,340 B2 | 5/2007 | Nolan |
| 7,230,264 B2 | 6/2007 | Thean et al. |
| 7,230,265 B2 | 6/2007 | Kaiser et al. |
| 7,241,631 B2 | 7/2007 | Huai et al. |
| 7,256,971 B2 | 8/2007 | Horng et al. |
| 7,270,896 B2 | 9/2007 | Parkin |
| 7,349,187 B2 | 3/2008 | Parkin |
| 7,351,483 B2 | 4/2008 | Parkin |
| 7,423,849 B2 | 9/2008 | Gill |
| 7,443,639 B2 | 10/2008 | Parkin |

(Continued)

OTHER PUBLICATIONS

Tsunekawa, et al, "Giant tunneling magnetoresistance effect in low-resistance CoFeB/MgO(001)/CoFeB magnetic tunnel junctions for read-head applications", Applied Physics Letters 87,072503, 3 Pages, 2005.

(Continued)

*Primary Examiner* — Allen T Cao

(57) ABSTRACT

A magnetoresistive sensor having a novel free layer and a method of producing the same are disclosed. The magnetoresistive sensor comprises a pinned layer, a barrier layer disposed over the pinned layer, and a free layer disposed over the barrier layer. The free layer comprises a first magnetic layer disposed over the barrier layer. The first magnetic layer has a positive spin polarization, a positive magnetostriction, and a polycrystalline structure. The free layer further comprises a second magnetic layer disposed over the first magnetic layer. The second magnetic layer has a negative magnetostriction and comprises at least cobalt (Co) and boron (B).

30 Claims, 5 Drawing Sheets

U.S. PATENT DOCUMENTS

| | | |
|---|---|---|
| 7,488,609 B1 | 2/2009 | Lin et al. |
| 7,495,796 B2 | 2/2009 | Keane et al. |
| 7,695,761 B1 | 4/2010 | Shen et al. |
| 7,751,156 B2 * | 7/2010 | Mauri et al. .............. 360/324.2 |
| 7,760,474 B1 | 7/2010 | Huai et al. |
| 7,800,868 B2 * | 9/2010 | Gao et al. ................ 360/324.12 |
| 7,916,433 B2 | 3/2011 | Huai et al. |
| 7,929,259 B2 * | 4/2011 | Gao et al. ................ 360/324.12 |
| 8,059,374 B2 | 11/2011 | Zhao et al. |
| 8,194,365 B1 | 6/2012 | Leng et al. |
| 2002/0009616 A1 | 1/2002 | Kamiguchi et al. |
| 2003/0179071 A1 | 9/2003 | Hiramoto et al. |
| 2004/0056288 A1 | 3/2004 | Fukuzumi |
| 2004/0091744 A1 | 5/2004 | Carey et al. |
| 2004/0219772 A1 | 11/2004 | You et al. |
| 2005/0009211 A1 | 1/2005 | Linn et al. |
| 2005/0120544 A1 | 6/2005 | Lam |
| 2005/0195534 A1 | 9/2005 | Gill |
| 2006/0071287 A1 | 4/2006 | Yuasa et al. |
| 2006/0093862 A1 | 5/2006 | Parkin |
| 2006/0102969 A1 | 5/2006 | Huai et al. |
| 2006/0128038 A1 | 6/2006 | Pakala et al. |
| 2006/0141640 A1 | 6/2006 | Huai et al. |
| 2006/0180839 A1 | 8/2006 | Fukumoto et al. |
| 2006/0209590 A1 | 9/2006 | Guo et al. |
| 2007/0074317 A1 | 3/2007 | Pakala et al. |
| 2007/0111332 A1 | 5/2007 | Zhao et al. |
| 2007/0139827 A1 | 6/2007 | Gao et al. |
| 2007/0188945 A1 | 8/2007 | Fuji et al. |
| 2007/0228501 A1 | 10/2007 | Nakamura et al. |
| 2007/0243639 A1 | 10/2007 | Pietambaram et al. |
| 2008/0030907 A1 | 2/2008 | Nakabayashi et al. |
| 2008/0062581 A1 | 3/2008 | Parkin |
| 2008/0080101 A1 | 4/2008 | Mauri et al. |
| 2008/0124454 A1 | 5/2008 | Djayaprawira et al. |
| 2008/0174921 A1 | 7/2008 | Ikarashi et al. |
| 2008/0179699 A1 | 7/2008 | Horng et al. |
| 2008/0299679 A1 | 12/2008 | Zhao et al. |
| 2009/0027810 A1 | 1/2009 | Horng et al. |
| 2009/0027813 A1 | 1/2009 | Carey et al. |
| 2010/0073827 A1 | 3/2010 | Zhao et al. |
| 2010/0255349 A1 * | 10/2010 | Gao et al. .................. 428/811.1 |

OTHER PUBLICATIONS

Read, et al., "X-ray photoemission study of CoFeB/MgO thin film bilayers", Applied Physics Letters 90, 132503, 3 Pages, 2007.

Park, et al., "Annealing effects on structural and transport properties of rf-sputtered CoFeB/MgO/CoFeB magnetic tunnel junctions", Journal of Applied Physics 99, 08a901, 3 Pages, 2006.

Park, et al. "Effect of adjacent layers on crystallization and magnetoresistance in CoFeB/MgO/CoFeB Magnetic Tunnel Junction" IEEE Transactions on Magnetics, vol. 42, No. 10, pp. 3639-2641, Oct. 2008.

Djayaprawira, et al., "230% room-temperature magnetoresistance in CoFeB/MgO/CoFeB magnetic tunnel junctions", Applied Physics Letters 86, 092502, 3 pages, 2005.

Tsunekawa, et al., "Huge Magnetoresistance and Low Junction Resistance in Magnetic Tunnel Junctions with Crystalline MgO Barrier", IEEE Transactions on Magnetics, vol. 42, No. 2, pp. 103-107, Feb. 2006.

Burton, et al., "Atomic and Electronic Structure of the CoFeB/MgO Interface From First Principles", Applied Physics Letters 89, 142507, 3 pages, 2006.

Neil Smith, "Fluctuation-dissipation considerations for phenomenological damping models for ferromagnetic thin film," Journal of Applied Physics, Oct. 1, 2002, vol. 92, No. 7, pp. 3877-3885.

Jian-Gang Zhu, "Magnetization Dynamics: Thermal Driven Noise in Magnetoresistive Sensors," Handbook of Magnetism and Advanced Magnetic Material, John Wiley & Sons, Ltd., 2007, 16 pages.

S.W. Sun, et al., "Possible giant surface magnetostriction in amorphous Co76Cr4B20", J. Appl. Phys. 69 (Abstract), Apr. 15, 1991, 5218.

* cited by examiner

PRIOR ART

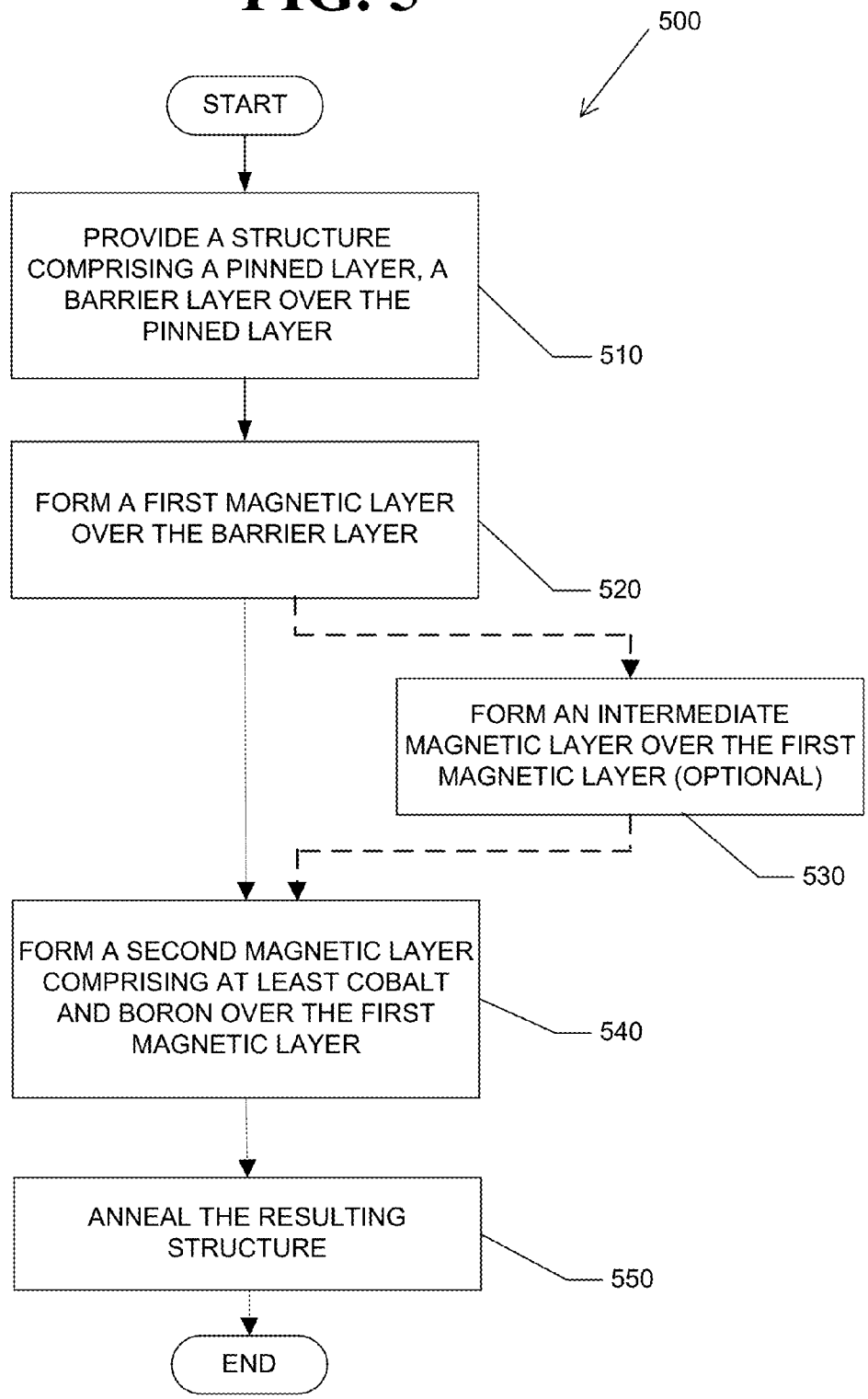

MAGNETORESISTIVE SENSORS HAVING AN IMPROVED FREE LAYER

FIELD OF THE INVENTION

The present invention generally relates to magnetic transducers and, in particular, relates to magnetoresistive sensors having an improved free layer.

BACKGROUND OF THE INVENTION

Tunnel magnetoresistance (TMR) sensors are frequently employed as magnetoresistive sensors in the magnetic heads of hard disk drives. As the areal density of hard disks approaches 1 Tb/in$^2$, it is desirable to reduce the magnetic reader gap spacing to about 25 nm or below. To do so will require a thinner TMR sensor stack, however. Many readers have a free layer (FL) about 60-80 nm in thickness, in order to achieve high TMR ratio (dR/R) and lower magnetostriction. This FL design involves a thin first magnetic layer acting as an interface layer that has a high spin polarization and a high positive magnetostriction. To counteract the high positive magnetostriction of the first magnetic layer and achieve a desired net low magnetostriction (e.g., below 2×10$^{-6}$) for the FL, a second, counteracting, magnetic layer with a negative magnetostriction may also be used.

One approach to providing a counteracting second magnetic layer involves using a nickel iron (NiFe) alloy with a Fe composition less than 10%, due to the low magnetic moment and low spin polarization degree of this material. In such an arrangement, a thick second magnetic layer and a thick first magnetic layer may be used to provide a high dR/R as well as a low magnetostriction. In addition, Ni-rich NiFe alloys have a high Gilbert damping constant, which contributes to a magnetic noise induced by a vibration of grain structures. Therefore, there is a need for a free layer structure that has a reduced overall thickness and a low Gilbert damping constant.

SUMMARY OF THE INVENTION

Various embodiments of the subject disclosure overcome the foregoing limitations by providing an improved multilayered FL structure comprising a first magnetic layer having a positive spin polarization and a positive magnetostriction and a second, counteracting, magnetic layer having a negative magnetostriction and also having relatively high magnetization (e.g., greater than 600 emu/cm3) and a low Gilbert damping constant (e.g., less than 0.02). In certain embodiments, the second magnetic layer is an alloy comprising cobalt (Co) and boron (B). In some embodiments, the first magnetic layer comprises a material, e.g., an alloy of cobalt and iron (CoFe), having a polycrystalline structure. Such an improved multilayered FL can have a reduced overall thickness as compared to conventional FLs which use NiFe as a second magnetic layer, thereby helping to reduce the total thickness of the sensor stack, and providing a lower Gilbert damping constant, which helps to reduce a magnetic noise for the TMR sensor.

According to one embodiment of the subject disclosure, a magnetoresistive sensor is provided. The magnetoresistive sensor can comprise a pinned layer. The magnetoresistive sensor can further comprise a barrier layer disposed over the pinned layer. The magnetoresistive sensor can comprise a free layer. The free layer can comprise a first magnetic layer disposed over the barrier layer. The first magnetic layer can have a positive spin polarization, a positive magnetostriction, and a polycrystalline structure. The free layer can further comprise a second magnetic layer disposed over the first magnetic layer. The second magnetic layer can have a negative magnetostriction. The second magnetic layer can comprise at least cobalt (Co) and boron (B).

According to one embodiment of the subject disclosure, a magnetoresistive sensor is provided. The magnetoresistive sensor can comprise a pinned layer. The magnetoresistive sensor can further comprise a barrier layer disposed over the pinned layer. The magnetoresistive sensor can comprise a free layer. The free layer can comprise a first magnetic layer disposed over the barrier layer. The first magnetic layer can have a positive spin polarization, a positive magnetostriction, and a polycrystalline structure. The free layer can further comprise a second magnetic layer disposed over the first magnetic layer. The second magnetic layer can have a negative magnetostriction. The second magnetic layer can further have a magnetization greater than 600 emu/cm$^3$. The second magnetic layer can further have a Gilbert damping constant less than 0.02.

According to one embodiment of the subject disclosure, a method of producing a magnetoresistive sensor is provided. The method can comprise providing a structure comprising a pinned layer and a barrier layer over the pinned layer. The method can further comprise forming a first magnetic layer over the barrier layer, the first magnetic layer having a positive spin polarization, a positive magnetostriction, and a polycrystalline structure. The method can further comprise forming a second magnetic layer over the first magnetic layer, the second magnetic layer having a negative magnetostriction and comprising at least cobalt (Co) and boron (B).

It is to be understood that both the foregoing summary of the invention and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention.

FIG. 5 is a flowchart illustrating an exemplary process for producing a magnetoresistive sensor (e.g., a TMR sensor) comprising a sensor stack such as the sensor stacks shown in FIGS. 1, 3, and 4 according to one aspect of the subject disclosure.

DETAILED DESCRIPTION OF THE INVENTION

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail to avoid unnecessarily obscuring the present invention.

Figure 1:
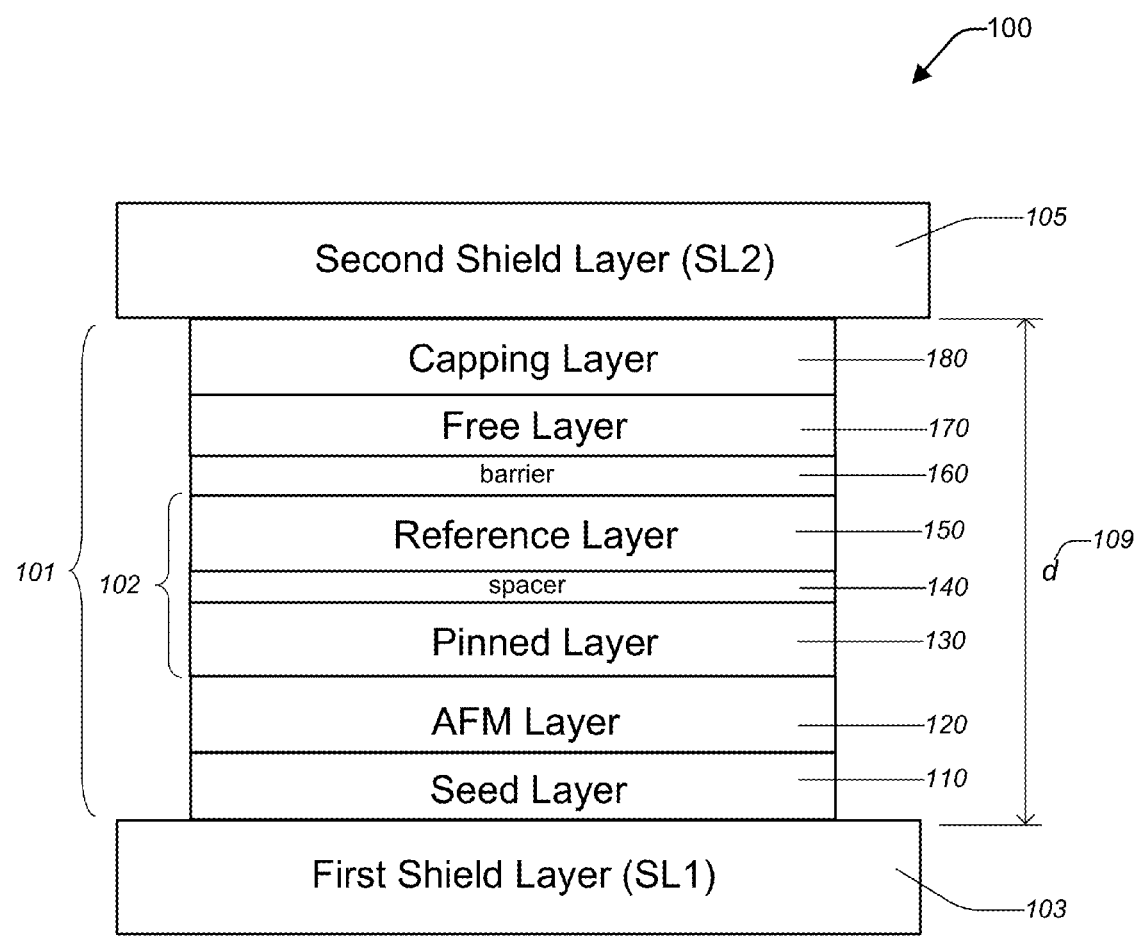
FIG. 1 is a diagram depicting a TMR element according to one aspect of the subject disclosure.

FIG. 1 is a diagram depicting a TMR element 100 according to one aspect of the subject disclosure. The TMR element 100 includes a sensor stack 101 disposed between a first (bottom) shield layer (SL1) 103 and a second (top) shield layer (SL2) 105 and having a shield-to-shield distance (d) 109. For simplicity, FIG. 1 is not drawn to scale. The sensor stack 101 includes a seed layer 110 disposed over the SL1 103, a pinning or anti-ferromagnetic (AFM) layer 120 disposed over the seed layer 120, a bottom electrode 102 disposed over the AFM layer 120, a tunnel barrier layer 160 disposed over the bottom electrode 102, a top electrode or free layer 170 disposed over the tunnel barrier layer 160, and a capping layer 180 disposed over the free layer 170.

In the following discussion, the tunnel barrier layer 160 is assumed to be a crystalline magnesium oxide (MgO) tunnel barrier layer. However, it shall be appreciated that the tunnel barrier layer 160 can comprise any thin insulating material layer that allows an electron to tunnel between the top and bottom electrodes. In addition, although not shown in FIG. 1, the crystalline MgO tunnel barrier 160 can include a thin Mg or Pt layer between the bottom electrode 102 and the MgO in the tunnel barrier layer 160. In the illustrated example, the bottom electrode 102 is a synthetic antiferromagnet that includes magnetic layers, namely, a pinned layer 130 and a reference layer 150 separated by a thin nonmagnetic, conductive spacer layer 140 that may include ruthenium (Ru). The capping layer 180 can be formed of materials such as Ta.

The magnetizations (not shown) of the pinned layer 130 and the reference layer 150 of the bottom electrode 102 are substantially fixed, or pinned. The top electrode or the free layer 170 may have a magnetization or moment (not shown) that may move, or switch. The pinning or AFM layer 120 is configured to fix the magnetization of the bottom electrode 102. Thus magnetization or moment of the pinned layer 130 is fixed, or pinned, in a particular direction, typically by an exchange-bias interaction with the AFM layer 120. However, the magnetization or moment of the free layer 170 may move, or switch, in response to an external field such as of a magnetic recording medium.

The electrical resistance through the tunnel barrier layer 160 varies with the relative orientation of the free layer magnetization compared with the reference layer magnetization and thereby converts magnetic signals into electrical signals. When a sense current is passed from the second (top) shield 105 to the first (bottom) shield 103 in a direction perpendicular to the planes of the TMR layers (CPP designation), a lower resistance is detected when the magnetization directions of the free and reference layers are in a parallel state ("1" memory state) and a higher resistance is detected when the magnetization directions are in an anti-parallel state ("0" memory state). Alternatively, a TMR sensor may be configured as a current in plane (CIP) structure which indicates the direction of the sense current.

Figure 2:
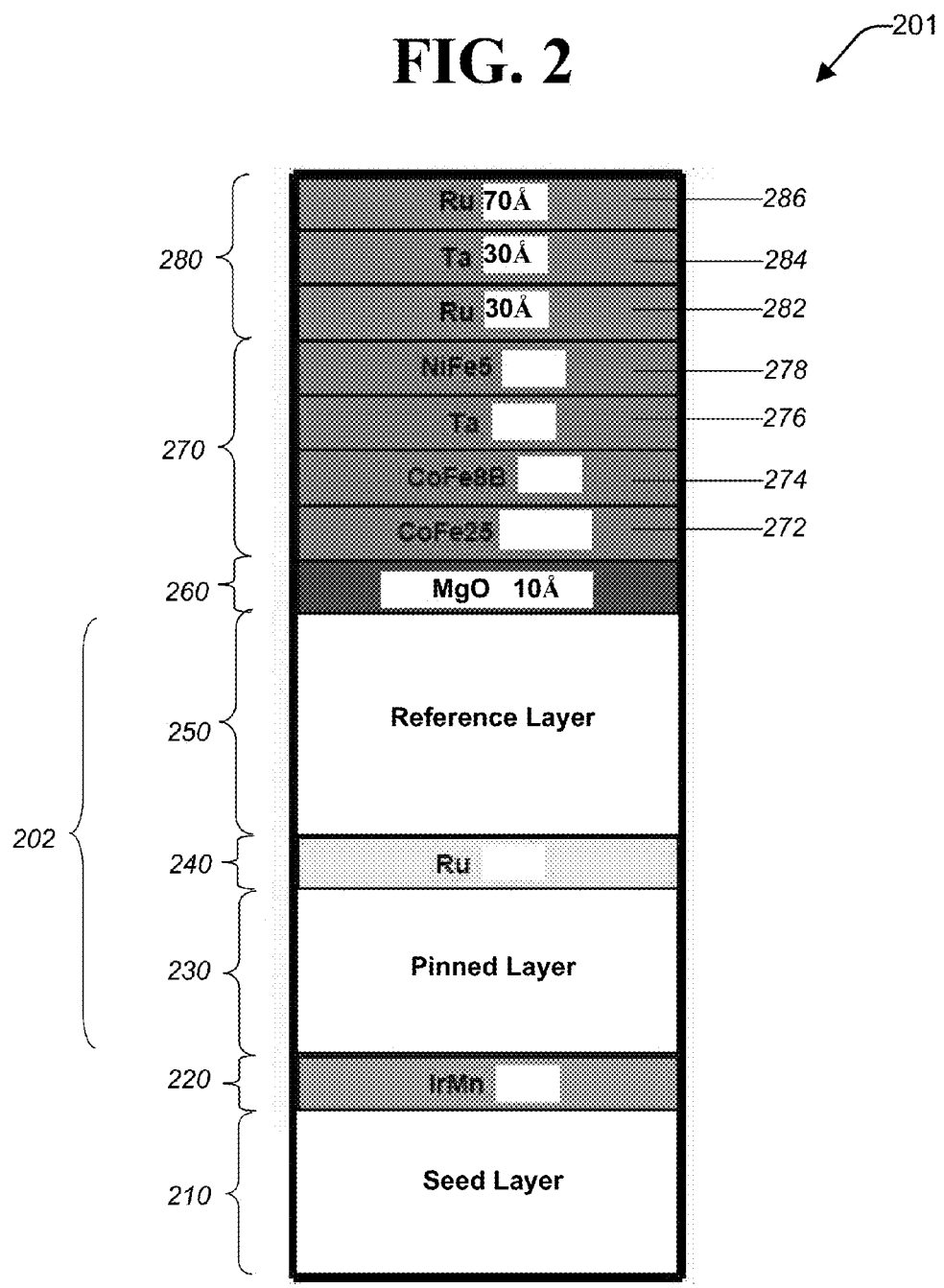
FIG. 2 is a diagram depicting a prior art sensor stack that can be employed in a conventional TMR sensor.

FIG. 2 is a diagram depicting a prior art sensor stack 201 that can be employed in a conventional TMR element. As with the sensor stack 101 of FIG. 1, the sensor stack 201 includes a seed layer 210, a pinning or AFM layer 220 disposed over the seed layer 210, a bottom electrode 202 comprising a pinned layer 230, a spacer layer 240, and a reference layer 250 disposed over the spacer layer 240, and a tunnel barrier layer 260 disposed over the bottom electrode 202. The sensor stack 201 further includes a free layer (FL) 270 disposed over the tunnel barrier layer 260 and a capping layer 280 disposed over the free layer 270.

In the particular sensor stack 201 depicted, the FL 270 includes a first FL sub-layer 272, a second FL sub-layer 274, a third FL sub-layer 276, and a fourth FL sub-layer 278. In the illustrated example, the first FL sub-layer 272 comprises an alloy of Co and Fe (CoFe) having 75% Co and 25% Fe ($Co_{0.75}Fe_{0.25}$). The second FL sub-layer 274 comprises an alloy of cobalt, iron and boron (CoFeB). The third FL sub-layer comprises Ta. The fourth FL sub-layer comprises an alloy of Ni and Fe (NiFe). The capping layer 280 includes a 30 Ta layer 284 disposed between bottom and top Ru layers 282, 286 having thicknesses of 3 Å and 70 Å respectively.

Focusing on the FL 270, the first FL sub-layer 272 constitutes the first magnetic layer having a high spin polarization and a positive magnetostriction, the second FL sub-layer 274 constitutes an intermediate magnetic layer, and the fourth FL sub-layer 278 constitutes the second magnetic layer having a negative magnetostriction to counteract the positive magnetostriction of the first magnetic layer and achieve a desired net low magnetostriction (e.g., below $2\times10^{-6}$) for the FL 270 as discussed above. Also as discussed above, the second magnetic layer (e.g., the fourth sub-layer 278) is made of a nickel iron alloy (NiFe) with Fe composition less than 10% due to the low magnetic moment and low spin polarization degree. Accordingly, a relatively thick (e.g., 37 Å) NiFe layer is employed, which, in turn, results in a relatively high shield-to-shield distance (d) 109 (FIG. 1). In addition, the Ni rich NiFe alloy, which has a high Gilbert damping constant, contributes to additional magnetic noise.

Figure 3:
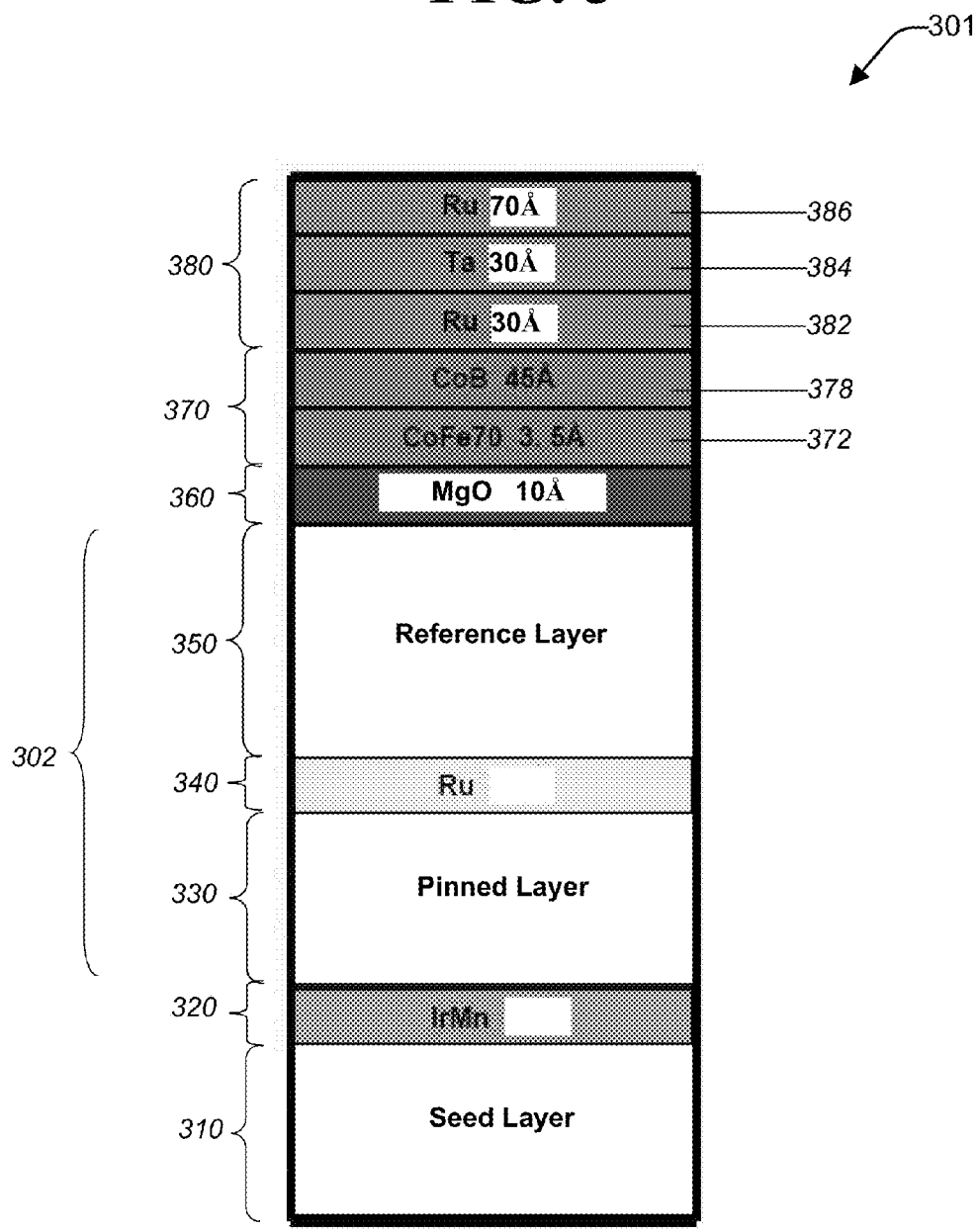
FIG. 3 is a diagram depicting a sensor stack having an exemplary free layer according to one aspect of the subject disclosure.

FIG. 3 is a diagram depicting a sensor stack 301 having a novel exemplary free layer 370 according to one aspect of the subject disclosure. For the purpose of comparison, each of seed layer 310, AFM layer 320, bottom electrode 302, tunnel barrier layer 360, and capping layer 380 of the sensor stack 301 is the same as a corresponding structure of the prior art sensor stack 201 depicted in FIG. 2. However, free layer 370 of the sensor stack 301 is different from the free layer 270 of the prior art sensor stack 202 depicted in FIG. 2. The free layer 370 includes a first magnetic layer 372 and a second magnetic layer 378. In the illustrated example, the first magnetic layer 372 is 3.5 Å thick and comprises 30% cobalt and 70% iron ($Co_{0.3}Fe_{0.7}$); and the second magnetic layer 378 is 45 Å thick and comprises an alloy of Co and B (CoB). The first magnetic layer 372 has a high spin polarization and a positive magnetostriction, while the second magnetic layer 378 has a negative magnetostriction to counteract the positive magnetostriction of the first magnetic layer 372. In certain embodiments, the spin polarization of the first magnetic layer 372 is greater than about 0.4.

In certain embodiments, a material comprising the first magnetic layer 372 has a polycrystalline structure, such as a polycrystalline alloy of CoFe. The use of a polycrystalline alloy of CoFe, for example, has certain advantages compared to the use of an amorphous alloy of CoFe. One of the advantages accrues from the fact that the polycrystalline alloy of CoFe contributes to a higher TMR ratio (dR/R) than the amorphous alloy of CoFe.

Whereas the FL 270 of the prior art sensor stack 201 includes four separate FL sub-layers 272, 274, 276, 278 having a total thickness of 6.3 nm, the FL 370 of the novel sensor stack 301 includes two separate FL sub-layers 372, 378 having a total thickness of 4.85 nm. As a result of the reduced thickness of the FL 370, a reduced shield-to-shield distance of 25 nm can be achieved for a TMR element employing the sensor stack 301. The reduced thickness of the FL 370 accrues at least in part from the use of a material for the second magnetic layer 378 that has a relatively high magnetization (e.g., greater than 600 emu/$cm^3$) and a low Gilbert damping constant (e.g., less than 0.02) as compared to the Ni rich NiFe alloy that is typically used for the second magnetic layer (e.g., the NiFe layer 278 of FIG. 2) in conventional sensor stacks.

The use of a higher magnetization material for the second magnetic layer (e.g., the CoB layer 378) of a free layer allows for the use of a thinner first magnetic layer (e.g., the fifth CoFe layer 372) in the free layer. The use of a high iron CoFe (e.g., $Co_{0.3}Fe_{0.7}$), which has a higher magnetization than a low iron CoFe (e.g., $Co_{0.75}Fe_{0.25}$), for the first magnetic layer 372 also allows the layer to be thinner and have a less magnetostriction effect for the entire FL structure 170B. The low Gilbert damping constant of the second magnetic layer 378 also reduces the magnetic noise for the TMR sensor.

It shall be appreciated by one skilled in the art that various modifications to the free layer 370 shown in FIG. 3 can be made to arrive at numerous alternative embodiments without departing from the scope of the subject disclosure. For example, while the first magnetic layer 372 shown in FIG. 3 is of a particular composition ($Co_{0.3}F_{0.7}$) and a particular thickness (3.5 Å), the first magnetic layer 372 can in general comprise $Co_{1-y}F_y$, where y is greater than or equal to zero and less than or equal to 1 and can have a thickness that is greater than 0 Å and not more than 15 Å. In some of such embodiments, y is at least 0.25 and not more than 0.75. Similarly, the second magnetic layer 378 can comprise $Co_{1-z}B_z$, where z is at least 0.1 and not more than 0.30, and can have a thickness that greater than 20 Å and not more than 70 Å. In some of such embodiments, z is about 0.2. In yet other alternative embodiments, the second magnetic layer 378 can comprise $(Co_{1-\gamma}X_\gamma)_{1-z}B_z$, where γ is greater than 0 and not more than 0.25, X is selected from the group consisting of Ni, chromium (Cr), and niobium (Nb), and z is at least 0.10 and not more than 0.30. In some of such embodiments, the second magnetic layer 372 can have a thickness greater than 20 Å and not more than 70 Å. In yet other alternative embodiments, the first magnetic layer can comprise $Co_{1-y}Fe_y$, and the second magnetic layer can comprise $Co_{1-z}B_z$, where y is about 0.7, and z is about 0.2.

In certain embodiments, the first and second magnetic layers 372, 378 of the FL 370 are configured (e.g., by selecting a particular combination of compositions and thicknesses for the sub layers) to minimize a Gilbert damping constant of the free layer. For example, a FL structure having a CoB second magnetic layer (e.g., 4 Å $Co_{0.3}Fe_{0.7}$/45 Å CoB/20 Å Ru/30 Å Ta) was determined to have a Gilbert damping constant of less than 0.01 as compared to other FL structures having a NiF second magnetic layer, which were determined to have similar Gilbert damping constants around 0.02. Therefore, a factor of 2 reduction in the Gilbert damping constant, with attendant reduction in magnetic noise, can be achieved by the use of the CoB second magnetic layer in place of the conventional NiF second magnetic layer. In some embodiments, the first and second magnetic layers of a free layer are configured (e.g., by selecting a particular combination of compositions and thicknesses for the sub layers) such that a net magnetostriction for the free layer is less than about $2 \times 10^{-6}$.

Figure 4:
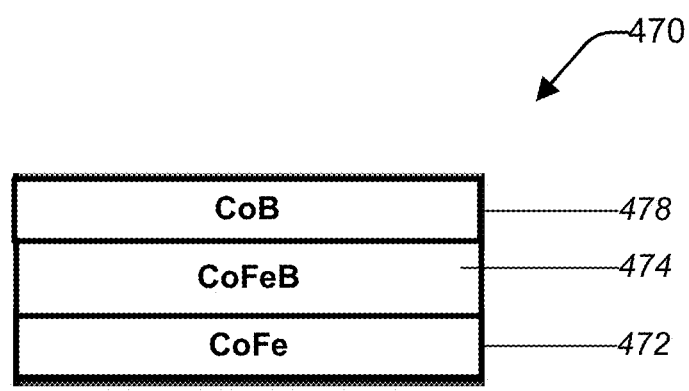
FIG. 4 is a diagraph illustrating an alternative free layer that includes an intermediate magnetic layer disposed between first and second magnetic layers according to one aspect of the subject disclosure.

In certain alternative embodiments, a free layer can include an intermediate magnetic layer disposed between first and second magnetic layers as illustrated by a novel exemplary free layer (FL) 470 depicted in FIG. 4. In the illustrated example, the FL 470 includes a first magnetic layer 472 comprising an alloy of Co and Fe (CoFe), an intermediate magnetic layer 474 comprising an alloy of Co, Fe, and B (CoFeB) formed over the first magnetic layer 472, and a second magnetic layer 478 comprising an alloy of cobalt and boron (CoB) formed over the intermediate magnetic layer 474. In certain embodiments, the intermediate magnetic layer 474 comprises $(Co_{1-\alpha}Fe_\alpha)_{1-\beta}B_\beta$, where α is at least 0.1 and not more than 0.6, and β is at least 0.1 and not more than 0.3. The intermediate magnetic layer 474 can have a thickness greater than 0 Å and not more than 60 Å.

FIG. 5 is a flowchart illustrating an exemplary process 500 for producing a magnetoresistive sensor (e.g., a TMR sensor) comprising a sensor stack, such as the sensor stacks 101, 301, and 501 shown in FIGS. 1, 3, 4, and 5, according to one aspect of the subject disclosure. The process 500 begins and proceeds to an operation 510, in which a structure comprising a pinned layer and a barrier layer is provided. As exemplified by FIG. 1, the operation 510 can further comprise providing a bottom shield layer (e.g., 103), forming a seed layer (e.g., 110) over the bottom shield layer, forming an AFM layer (e.g., 120) over the seed layer, over which seed layer the pinned layer mentioned above is formed. The operation 510 can further comprise forming a spacer layer (e.g., 140) over the pinned layer, forming a reference layer (e.g., 150) over the spacer layer, over which reference layer the barrier layer mentioned above is formed. Exemplary compositions for various layers indicated above were described above with respect to FIGS. 1-4 and are not repeated here. Also various methods of forming (e.g., depositing) the indicated layers are known in the art and are not described here for the sake of brevity.

The process 500 proceeds to an operation 520, in which a first magnetic layer is formed over the barrier layer. As described above, the first magnetic layer comprises a material, such as an alloy of cobalt and iron (CoFe), that has a positive spin polarization and a positive magnetostriction. Also as described above, the material for the first magnetic layer can also have a polycrystalline structure. For example, a polycrystalline CoFe can be deposited on the barrier layer by a DC magnetron sputter deposition process carried out under an ambient pressure of less than $10^{-8}$ Torr.

The process 500 can proceed either directly to an operation 540 or to an optional operation 530 before proceeding to the operation 540. In the latter case, an intermediate magnetic layer is formed over the first magnetic layer at the operation 530. For example, an alloy of Co, Fe, and B (CoFeB) can be deposited over the first magnetic layer comprising a polycrystalline CoFe also by a dc magnetron sputter deposition process. After the optional operation 530, the process 500 proceeds to the operation 540, in which a second magnetic layer is formed over the intermediate magnetic layer, as exemplified by the FL 470 of FIG. 4. As described above, the second magnetic layer can comprise at least Co and B and have a negative magnetostriction to counteract the positive magnetostriction of the first magnetic layer. For example, a CoB alloy comprising the second magnetic layer can be deposited over a CoFeB intermediate magnetic layer also by a dc magnetron sputter deposition process.

In the former case (where the process 500 proceeds directly to the operation 540), a second magnetic layer can be formed directly over the first magnetic layer, as exemplified by the FL 370 of FIG. 3. For example, an alloy of Co, Fe, and B (CoFeB) can be deposited over the first magnetic layer comprising a polycrystalline CoFe also by a dc magnetron sputter deposition process.

Various exemplary compositions and thicknesses for the first and second magnetic layers and the intermediate magnetic layer were describe above with respect to FIGS. 3-4 and are not repeated here.

The process 500 then proceeds to an operation 550, in which the resulting structure comprising the pinned layer, the barrier layer, and the first and second magnetic layers (and the optional intermediate magnetic layer) is annealed by heating the structure at 250-350° C. for 1 to 10 hours, for example. The annealing process can induce or enhance crystallization in the barrier layer, thereby increasing the overall TMR ratio for the magnetoresistive sensor.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various functions and elements described herein may be partitioned differently from those shown without departing from the spirit and scope of the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments of the invention described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

What is claimed is:

1. A magnetoresistive sensor comprising:
    a pinned layer;
    a barrier layer disposed over the pinned layer; and
    a free layer comprising:
        a first magnetic layer disposed over the barrier layer, the first magnetic layer having a positive spin polarization, a positive magnetostriction, and a polycrystalline structure; and
        a second magnetic layer disposed over the first magnetic layer without having another magnetic layer disposed between the first and second magnetic layers, the second magnetic layer having a negative magnetostriction and comprising at least cobalt (Co) and boron (B).

2. The magnetoresistive sensor of claim 1, wherein the first magnetic layer comprises at least Co and iron (Fe).

3. The magnetoresistive sensor of claim 1, wherein the first magnetic layer comprises $Co_{1-y}Fe_y$, wherein y is greater than or equal to zero and less than or equal to 1.

4. The magnetoresistive sensor of claim 3, wherein y is at least 0.25 and not more than 0.75.

5. The magnetoresistive sensor of claim 4 wherein y is about 0.3.

6. The magnetoresistive sensor of claim 1, wherein the spin polarization of the first magnetic layer is greater than about 0.4.

7. The magnetoresistive sensor of claim 1, wherein a thickness of the first magnetic layer is greater than 0 Å and not more than 15 Å.

8. The magnetoresistive sensor of claim 1, wherein the second magnetic layer comprises $Co_{1-z}B_z$, wherein z is at least 0.10 and not more than 0.30.

9. The magnetoresistive sensor of claim 8, wherein z is about 0.20.

10. The magnetoresistive sensor of claim 8, wherein a thickness of the second magnetic layer is greater than 20 Å and not more than 70 Å.

11. The magnetoresistive sensor of claim 1, further comprising an intermediate magnetic layer disposed between the first magnetic layer and the second magnetic layer, the intermediate magnetic layer comprising $(Co_{1-\alpha}Fe_\alpha)_{1-\beta}B_\beta$, wherein:
    $\alpha$ is at least 0.1 and not more than 0.6; and
    $\beta$ is at least 0.1 and not more than 0.3.

12. The magnetoresistive sensor of claim 11, wherein a thickness of the intermediate magnetic layer is greater than 0 Å and not more than 60 Å.

13. The magnetoresistive sensor of claim 1, wherein the second magnetic layer comprises $(Co_{1-\gamma}X_\gamma)_{1-z}B_z$, wherein:
    $\gamma$ is greater than 0 and not more than 0.25;
    X is selected from the group consisting of nickel (Ni), chromium (Cr), and niobium (Nb); and
    z is at least 0.10 and not more than 0.30.

14. The magnetoresistive sensor of claim 13, wherein a thickness of the second magnetic layer is greater than 20 Å and not more than 70 Å.

15. The magnetoresistive sensor of claim 1, wherein the first and second magnetic layers are configured to minimize a Gilbert damping constant thereof.

16. The magnetoresistive sensor of claim 1, wherein:
    the first magnetic layer comprises $Co_{1-y}Fe_y$; and
    the second magnetic layer comprises $Co_{1-z}B_z$, wherein:
        y is about 0.7, and
        z is about 0.2.

17. The magnetoresistive sensor of claim 1, wherein the first and second magnetic layers are configured such that a net magnetostriction for the free layer is less than about $2 \times 10^{-6}$.

18. The magnetoresistive sensor of claim 1, wherein the second magnetic layer disposed on the first magnetic layer.

19. A magnetoresistive sensor comprising:
    a pinned layer;
    a barrier layer disposed over the pinned layer; and
    a free layer comprising:
        a first magnetic layer disposed over the barrier layer, the first magnetic layer having a positive spin polarization, a positive magnetostriction, and a polycrystalline structure; and
        a second magnetic layer disposed over the first magnetic layer, the second magnetic layer having a negative magnetostriction, a magnetization greater than 600 $emu/cm^3$, and a Gilbert damping constant less than 0.02.

20. The magnetoresistive sensor of claim 19, wherein the first magnetic layer comprises $Co_{1-y}Fe_y$, wherein y is greater than or equal to zero and less than or equal to 1.

21. The magnetoresistive sensor of claim 19, wherein the second magnetic layer comprises $(Co_{1-\gamma}X_\gamma)_{1-z}B_z$, wherein:
    $\gamma$ is greater than zero and not more than 0.25;
    X is selected from a group consisting from nickel (Ni), chromium (Cr), and niobium (Nb); and
    z is at least 0.10 and not more than 0.30.

22. The magnetoresistive sensor of claim 19 further comprising an intermediate magnetic layer disposed between the first magnetic layer and the second magnetic layer, the intermediate magnetic layer comprising $(Co_{1-\alpha}Fe_\alpha)_{1-\beta}B_\beta$, wherein:

α is at least 0.1 and not more than 0.6; and

β is at least 0.1 and not more than 0.3.

23. A method of producing a magnetoresistive sensor, the method comprising:

providing a structure comprising a pinned layer and a barrier layer over the pinned layer;

forming a first magnetic layer over the barrier layer, the first magnetic layer having a positive spin polarization, a positive magnetostriction, and a polycrystalline structure; and forming a second magnetic layer over the first magnetic layer without having another magnetic layer disposed between the first and second magnetic layers, the second magnetic layer having a negative magnetostriction and comprising at least cobalt (Co) and boron (B).

24. The method of claim 23, wherein the first magnetic layer comprises $Co_{1-y}Fe_y$, wherein y is greater than or equal to zero and less than or equal to 1.

25. The method of claim 23, wherein the second magnetic layer comprises $(Co_{1-\gamma}X_\gamma)_{1-z}B_z$, wherein:

γ is greater than 0 and not more than 0.25;

X is selected from the group consisting of nickel (Ni), chromium (Cr), and niobium (Nb); and z is at least 0.10 and not more than 0.30.

26. The method of claim 23 further comprising forming an intermediate magnetic layer between the first magnetic layer and the second magnetic layer, the intermediate magnetic layer comprising $(Co_{1-\alpha}Fe_\alpha)_{1-\beta}B_\beta$, wherein:

α is at least 0.1 and not more than 0.6; and

β is at least 0.1 and not more than 0.3.

27. The method of claim 23, wherein the first and second magnetic layers are configured such that a net magnetostriction for the free layer is less than about $2\times10^{-6}$.

28. The method of claim 23, wherein the first and second magnetic layers are configured to minimize a damping constant thereof.

29. The method of claim 23 further comprising annealing a structure comprising the pinned layer, the barrier layer, and the first and second magnetic layers.

30. The method of claim 23, wherein the second magnetic layer is formed on the first magnetic layer.

* * * * *